(12) United States Patent
Ikeda et al.

(10) Patent No.: US 9,088,002 B2
(45) Date of Patent: Jul. 21, 2015

(54) LIGHT-EMITTING DEVICE AND MANUFACTURING METHOD THEREOF

(75) Inventors: Hisao Ikeda, Kanagawa (JP); Satoshi Seo, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/370,958

(22) Filed: Feb. 10, 2012

(65) Prior Publication Data

US 2012/0205633 A1   Aug. 16, 2012

(30) Foreign Application Priority Data

Feb. 11, 2011  (JP) ................................. 2011-027998

(51) Int. Cl.
  *H01L 29/08* (2006.01)
  *H01L 51/50* (2006.01)

(52) U.S. Cl.
  CPC ............ *H01L 51/5056* (2013.01); *H01L 51/50* (2013.01); *H01L 2251/552* (2013.01)

(58) Field of Classification Search
  USPC .......... 257/40, 642–643, 759; 438/29, 69, 82, 438/99
  See application file for complete search history.

(56) References Cited

U.S. PATENT DOCUMENTS

| | | | |
|---|---|---|---|
| 6,432,561 B1 | 8/2002 | Yamazaki | |
| 6,620,528 B1 | 9/2003 | Yamazaki et al. | |
| 6,806,491 B2 * | 10/2004 | Qiu et al. | ......................... 257/40 |
| 6,951,694 B2 | 10/2005 | Thompson et al. | |
| 7,158,161 B2 | 1/2007 | Gyoutoku et al. | |
| 7,387,904 B2 | 6/2008 | Saito et al. | |
| 7,462,883 B2 | 12/2008 | Kumaki et al. | |
| 7,521,855 B2 | 4/2009 | Sakata et al. | |
| 7,545,840 B2 | 6/2009 | Yukawa | |
| 7,605,534 B2 | 10/2009 | Yamazaki et al. | |
| 7,626,198 B2 | 12/2009 | Hirakata et al. | |
| 7,649,197 B2 | 1/2010 | Iwaki et al. | |
| 7,667,389 B2 | 2/2010 | Ikeda et al. | |
| 7,683,532 B2 | 3/2010 | Abe et al. | |
| 7,714,501 B2 | 5/2010 | Nomura et al. | |
| 2004/0077113 A1 * | 4/2004 | Yamazaki et al. | .............. 438/29 |
| 2004/0161192 A1 | 8/2004 | Hamano et al. | |

(Continued)

FOREIGN PATENT DOCUMENTS

| | | |
|---|---|---|
| EP | 1 524 706 A2 | 4/2005 |
| EP | 1 530 245 A2 | 5/2005 |

(Continued)

*Primary Examiner* — Selim Ahmed
*Assistant Examiner* — Moin Rahman
(74) *Attorney, Agent, or Firm* — Husch Blackwell LLP

(57) ABSTRACT

An object of the present invention is to decrease the conductivity of a hole-injection layer (or a hole-transport layer) containing molybdenum oxide without decreasing the amount of molybdenum oxide so that crosstalk is prevented from occurring. A light-emitting element includes, between an anode and a cathode, an EL layer including at least a hole-injection layer and a light-emitting layer. In the light-emitting element, the hole-injection layer is provided between the anode and the light-emitting layer, and the hole-injection layer contains molybdenum oxide and an additive. The additive may be an alkali metal, an alkaline earth metal, a substance having a HOMO level of lower than or equal to $-5.8$ eV, or a substance having a hole mobility of lower than or equal to $10^{-7}$ cm$^2$/Vs.

20 Claims, 7 Drawing Sheets

(56) References Cited

U.S. PATENT DOCUMENTS

| | | | |
|---|---|---|---|
| 2004/0214034 A1* | 10/2004 | Utsugi et al. | 428/690 |
| 2005/0084712 A1 | 4/2005 | Kido et al. | |
| 2005/0170208 A1 | 8/2005 | Yatsunami et al. | |
| 2006/0008740 A1 | 1/2006 | Kido et al. | |
| 2006/0046096 A1 | 3/2006 | Nomura et al. | |
| 2006/0102910 A1* | 5/2006 | Yamazaki et al. | 257/83 |
| 2006/0118166 A1 | 6/2006 | Iwaki | |
| 2006/0180812 A1 | 8/2006 | Sakata et al. | |
| 2006/0228822 A1 | 10/2006 | Hayakawa et al. | |
| 2006/0232203 A1 | 10/2006 | Noda | |
| 2006/0243967 A1 | 11/2006 | Nomura et al. | |
| 2006/0263638 A1 | 11/2006 | Kawakami et al. | |
| 2006/0270066 A1 | 11/2006 | Imahayashi et al. | |
| 2006/0284189 A1 | 12/2006 | Sakata et al. | |
| 2006/0284204 A1 | 12/2006 | Yamazaki et al. | |
| 2006/0292394 A1 | 12/2006 | Iwaki et al. | |
| 2007/0000487 A1 | 1/2007 | Sakata | |
| 2007/0001570 A1 | 1/2007 | Nomura et al. | |
| 2007/0007516 A1 | 1/2007 | Seo et al. | |
| 2007/0013301 A1 | 1/2007 | Yamazaki et al. | |
| 2007/0029929 A1 | 2/2007 | Nakamura et al. | |
| 2007/0085106 A1 | 4/2007 | Kawakami et al. | |
| 2007/0150206 A1 | 6/2007 | Iwaki et al. | |
| 2007/0172699 A1 | 7/2007 | Nakashima et al. | |
| 2007/0194306 A1 | 8/2007 | Yamazaki et al. | |
| 2007/0200125 A1 | 8/2007 | Ikeda et al. | |
| 2007/0210322 A1 | 9/2007 | Ohsawa et al. | |
| 2008/0008905 A1 | 1/2008 | Yamazaki | |
| 2008/0017853 A1 | 1/2008 | Egawa et al. | |
| 2008/0122350 A1* | 5/2008 | Sakata et al. | 313/504 |
| 2008/0246028 A1 | 10/2008 | Ikeda et al. | |
| 2008/0308794 A1 | 12/2008 | Ibe et al. | |
| 2009/0001879 A1 | 1/2009 | Ikeda et al. | |
| 2009/0001886 A1 | 1/2009 | Ibe et al. | |
| 2009/0004506 A1 | 1/2009 | Nomura et al. | |
| 2009/0091253 A1* | 4/2009 | Yasukawa et al. | 313/504 |
| 2009/0117807 A1* | 5/2009 | Uno et al. | 445/3 |
| 2009/0160319 A1* | 6/2009 | Song et al. | 313/504 |
| 2009/0165854 A1 | 7/2009 | Yamazaki et al. | |
| 2009/0218934 A1* | 9/2009 | Song et al. | 313/504 |
| 2009/0224656 A1* | 9/2009 | Song et al. | 313/504 |
| 2009/0243475 A1* | 10/2009 | Shoda et al. | 313/504 |
| 2009/0278445 A1* | 11/2009 | Jen et al. | 313/504 |
| 2010/0059741 A1* | 3/2010 | Ohsawa et al. | 257/40 |
| 2010/0084646 A1* | 4/2010 | Matsusue et al. | 257/40 |
| 2010/0301383 A1 | 12/2010 | Shitagaki et al. | |

FOREIGN PATENT DOCUMENTS

| | | |
|---|---|---|
| JP | 9-63771 | 3/1997 |
| JP | 11-307259 | 11/1999 |
| JP | 2005-26121 | 1/2005 |
| JP | 2011-9205 | 1/2011 |
| WO | WO 2009/030981 A2 | 3/2009 |

\* cited by examiner

LIGHT-EMITTING DEVICE AND MANUFACTURING METHOD THEREOF

BACKGROUND OF THE INVENTION

1. Field of the Invention

The present invention relates to a light-emitting device and a manufacturing method thereof.

2. Description of the Related Art

In recent years, EL display devices which are light-emitting devices have been developed and are gradually put into practical use. On the other hand, as lighting equipment, EL lighting devices each including a light-emitting element that is similar to a light-emitting element provided in an EL display device have also been developed.

As for manufacturing of such a light-emitting element, a technique has been known in which molybdenum oxide is added to a hole-injection layer in order to improve the hole-injection property of the light-emitting element, keeping the planarity of a lower electrode that is a surface where a light-emitting material or the like is evaporated.

REFERENCE

Patent Document

[Patent Document 1] Japanese Published Patent Application No. 2011-9205

SUMMARY OF THE INVENTION

The conductivity (hole-injection property) of a light-emitting element is improved by addition of molybdenum oxide to a hole-injection layer (or a hole-transport layer). However, such an improvement in the conductivity of the light-emitting element causes current flow in a light-emitting element of an adjacent pixel through the hole-injection layer (or the hole-transport layer), so that the light-emitting element of the adjacent pixel emits light. In other words, crosstalk occurs. When the amount of molybdenum oxide included in the hole-injection layer (or the hole-transport layer) is simply reduced in order to suppress the improvement in the conductivity, the hole-injection layer (or the hole-transport layer) is easily crystallized. When a layer included in an EL layer, such as the hole-injection layer (or the hole-transport layer), is crystallized, variations in thickness of the hole-injection layer (or the hole-transport layer) occurs, causing a problem of a decrease in reliability of the light-emitting element.

An object of one embodiment of the present invention is to prevent crosstalk by decreasing the conductivity of a hole-injection layer (or a hole-transport layer) including molybdenum oxide without decreasing the amount of molybdenum oxide included in the hole-injection layer (or the hole-transport layer).

One embodiment of the present invention is a light-emitting element in which a hole-injection layer (or a hole-transport layer) is prevented from being crystallized and crosstalk between adjacent pixels can be prevented from occurring by addition of an additive to the hole-injection layer (or the hole-transport layer) to which molybdenum oxide is added, a light-emitting device including the light-emitting element, and manufacturing methods thereof. The additive is a material that can be evaporated.

In one embodiment of the present invention, a donor substance, for example, can be used as the additive. The donor substance is an alkali metal or an alkaline earth metal. It is preferable to use Li or Ca as the donor substance. This is because Li is easily and uniformly mixed into a material for the hole-injection layer, and Ca has a lower reactivity with the air and water than Li and thus is easily handled. In the case where Li is used as the additive, the concentration of Li is preferably 1 wt % to 10 wt %.

In one embodiment of the present invention, as the additive, a substance having a low reactivity with molybdenum oxide may be used, for example. The size of a substance used as the additive is preferably large (equal to or larger than a host material) because the substance is used to decrease the conductivity of the hole-injection layer.

Note that the HOMO level of the substance having a low reactivity with molybdenum oxide is lower than or equal to −5.8 eV, preferably lower than or equal to −5.9 eV. Examples of the substance having a low reactivity with molybdenum oxide include a dibenzoquinoxaline-based substance, a phenanthroline-based substance, a triazole-based substance and an oxadiazole-based substance.

Examples of the dibenzoquinoxaline-based substance include 2-[3-(dibenzothiophen-4-yl)phenyl]dibenzo[f,h]quinoxaline, 2-[4-(3,6-diphenyl-9H-carbazol-9-yl)phenyl]dibenzo[f,h]quinoxaline, 2-[3-(dibenzothiophen-4-yl)phenyl]-3-phenyldibenzo[f,h]quinoxaline, 7-[3-(dibenzothiophen-4-yl)phenyl]dibenzo[f,h]quinoxaline, 2-phenyldibenzo[f,h]quinoxaline, 2-[3-(3,6-diphenyl-9H-carbazol-9-yl)phenyl]dibenzo[f,h]quinoxaline, 2-[4-(dibenzothiophen-4-yl)phenyl]dibenzo[f,h]quinoxaline, 2-[3-(3'-dibenzothiophen-4-yl)biphenyl]dibenzo[f,h]quinoxaline, 2-[3-(dibenzofuran-4-yl)phenyl]dibenzo[f,h]quinoxaline, 6-[3-(dibenzothiophen-4-yl)phenyl]-dibenzoquinoxaline, 2-[4-(dibenzothiophen-2-yl)phenyl]dibenzo[f,h]quinoxaline.

Examples of the phenanthroline-based substance include 2,9-dimethyl-4,7-diphenyl-1,10-phenanthroline, 2-(4-t-butylphenyl)-4,7-diphenyl-1,10-phenanthroline, 2-naphthyl-4,7-diphenyl-1,10-phenanthroline, and 2-(naphthalen-2-yl)-4,7-diphenyl-1,10-phenanthroline.

Examples of the triazole-based substance include 9-[4-(3,5-diphenyl-1H-1,2,4-triazol-1-yl)]phenyl-9H-carbazole (abbreviation CzTAZ(1H)), 9-[4'''-(3,5-diphenyl-1H-1,2,4-triazol-1-yl)-[1,1':2',1":2",1''']quaterphenyl-4-yl]-9H-carbazole (abbreviation:Z-CzPTAZ(1H)), and 3-[4-(dibenzothiophen-4-yl)phenyl]-4,5-diphenyl-4H-1,2,4-triazole (abbreviation: DBTTAZ-2).

Examples of the oxadiazole-based substance include 9-[4-(3-phenyl-1,2,4-oxadiazol-5-yl)]phenyl-9H-carbazole (abbreviation: CzOd), 2,5-[4-(dibenzothiophen-1-yl)diphenyl]-1,3,4-oxadiazole, 2,5-[4-(2,7-diphenyldibenzothiophen-4-yl)diphenyl]-1,3,4-oxadiazole, and 2,5-bis[4,4"(dibenzothiophen-1-yl)phenyl]-1,3,4-oxadiazole.

In one embodiment of the present invention, a substance having a hole mobility lower than or equal to $10^{-7}$ cm$^2$/Vs may be used as the additive. Here, the additive is preferably an organic substance.

Note that at least the hole-injection layer and the light-emitting layer are provided between an anode and a cathode of a light-emitting element. The other layers may be provided as appropriate, if necessary. Here, an electron-injection layer, an electron-transport layer, a hole-transport layer, and the like correspond to the other layers.

According to one embodiment of the present invention, crosstalk can be prevented from occurring by decreasing the conductivity of a hole-injection layer (or a hole-transport layer) without decreasing the amount of molybdenum oxide in the hole-injection layer (or the hole-transport layer).

DETAILED DESCRIPTION OF THE INVENTION

Embodiments of the present invention are described below with reference to drawings. However, the present invention is not limited to the description given below, and it will be readily apparent to those skilled in the art that various changes and modifications in modes and details thereof can be made without departing from the purpose and scope of the present invention. Therefore, the present invention should not be interpreted as being limited to the description of Embodiments given below.

Embodiment 1

In this embodiment, a light-emitting element and a light-emitting device each of which is one embodiment of the present invention will be described.

Figure 1:
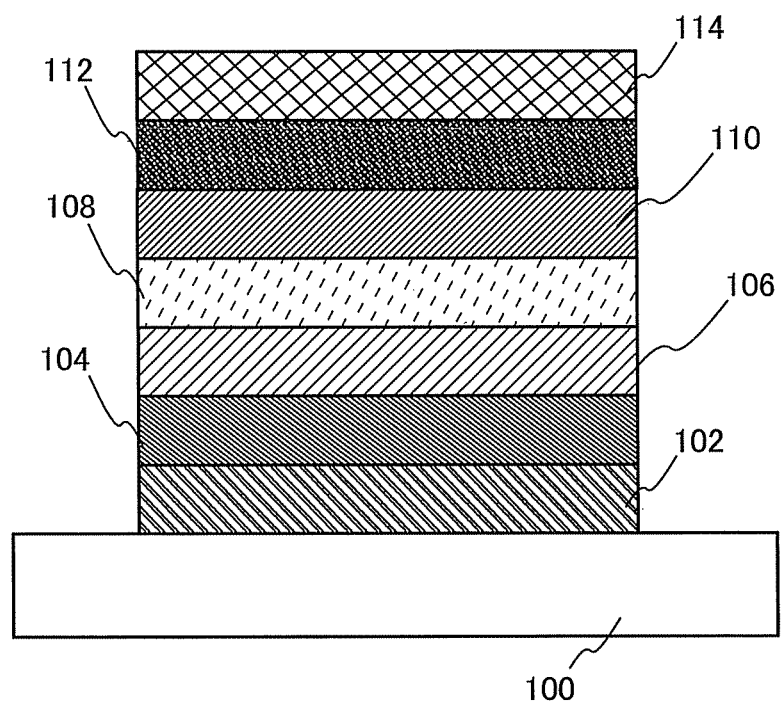
FIG. 1 illustrates a light-emitting element which is one embodiment of the present invention.

FIG. 1 illustrates a structure of a light-emitting element in this embodiment. The light-emitting element illustrated in FIG. 1 includes an anode 102 provided over a substrate 100, a hole-injection layer 104 provided over the anode 102, a hole-transport layer 106 provided over the hole-injection layer 104, a light-emitting layer 108 provided over the hole-transport layer 106, an electron-transport layer 110 provided over the light-emitting layer 108, an electron-injection layer 112 provided over the electron-transport layer 110, and a cathode 114 provided over the electron-injection layer 112.

The substrate 100 is used as a support of the light-emitting element. Examples of the substrate 100 include a glass substrate, a quartz substrate, and a plastic substrate.

As specific examples of the glass substrate, any of the following substrates can be used: non-alkaline glass substrates formed using barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. For example, a glass substrate which contains more barium oxide (BaO) than boric oxide ($B_2O_3$) and has a strain point of 730° C. or higher is preferable. This is because the glass substrate does not strain even when a semiconductor layer in a transistor provided together with a light-emitting element is subjected to heat treatment at a high temperature of about 700° C.

In the case where the substrate 100 is a mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

Alternatively, a metal substrate such as a stainless steel alloy substrate which is provided with an insulating film over the surface may be used. A plastic substrate has features such as being lightweight, being flexible, and making visible light transmitted, which are attractive as a substrate of a light-emitting element. A substrate in which a film with moisture resistivity is deposited onto or attached to a plastic substrate may be used so that the light-emitting element can be protected against an impurity such as water.

In addition, an insulating film as a base film may be formed over the substrate 100. The base film may be formed to have a single-layer structure or a stacked-layer structure of a silicon oxide film, a silicon nitride film, a silicon oxynitride film, and/or a silicon nitride oxide film by a CVD method, a sputtering method, or the like.

Note that "silicon nitride oxide" contains more nitrogen than oxygen. In the case where measurements are performed using Rutherford backscattering spectrometry (RBS) and hydrogen forward scattering (HFS), silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

Note that "silicon oxynitride" contains more oxygen than nitrogen. In the case where measurements are performed using RBS and HFS, silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively.

Note that percentages of nitrogen, oxygen, silicon, and hydrogen fall within the ranges given above, where the total number of atoms contained in the silicon oxynitride or the silicon nitride oxide is defined as 100 at. %.

The anode 102 is an electrode farmed using metal, an alloy, an electrically conductive compound, mixtures thereof, or the like with a high work function (specifically 4.0 eV or higher). Specifically, examples of a material for the anode 102 include indium oxide-tin oxide (ITO: indium tin oxide), indium oxide-tin oxide containing silicon or silicon oxide, indium oxide-zinc oxide, and indium oxide containing tungsten oxide and zinc oxide. In addition, examples of the material for the anode 102 include gold, platinum, nickel, tungsten, chromium, molybdenum, iron, cobalt, copper, palladium, titanium, and nitrides of these metal materials (e.g., titanium nitride).

The anode 102 may be funned by sputtering. For example, in the case where the material for the anode 102 is indium oxide-zinc oxide, a target in which zinc oxide is added to indium oxide at 1 wt % to 20 wt % may be used. Alternatively, in the case where the material for the anode 102 is an indium oxide containing tungsten oxide and zinc oxide, a target in which tungsten oxide is added to indium oxide at 0.5 wt % to 5 wt % and zinc oxide is added to the indium oxide at 0.1 wt % to 1 wt % may be used. Further alternatively, the anode 102 may be formed by ink-jet, spin coating, or the like by application of a sol-gel process or the like.

Note that the anode 102 may have a structure in which a reflective electrode and a light-transmitting electrode are stacked.

Known substances may be used for an EL layer over the anode 102, and either a low molecular compound or a high molecular compound can be used. Note that as materials for the EL layer, a material including an organic compound and partly including an inorganic compound can be used as well as a material including only an organic compound.

As the hole-injection layer 104, a mixed layer containing an organic compound with a hole mobility of $10^{-6}$ cm$^2$/Vs or higher, molybdenum oxide, and an additive can be used.

As the organic compound, either a low molecular compound or a high molecular compound can be used. Examples of the low molecular compound include 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N'-bis{4-[bis(3-methylphenyl)amino]phenyl}mine (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and 2-tert-butyl-9,10-di(2-naphthyl)anthracene (abbreviation: t-BuDNA).

Examples of the high molecular compound include oligomer, dendrimer, and polymer. For example, any of the following high molecular compounds can be used: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N-bis(4-butylphenyl)-N, N-bis(phenyl)benzidine] (abbreviation: Poly-TPD).

The hole-transport layer 106 is a layer containing a substance having a high hole-transport property (the hole mobility is preferably $10^{-6}$ cm$^2$/Vs or higher). Examples of the substance having a high hole-transport property include aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP), 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here mainly have a hole mobility of $10^{-6}$ cm$^2$/Vs or higher. Note that a substance other than the above described substances may be used as long as the substance has a higher hole-transport property than an electron-transport property. Note also that the layer containing a substance having a high hole-transport property may be a single layer or a stacked layer of two or more layers.

For the hole-transport layer 106, a carbazole derivative, such as 4,4'-di(N-carbazolyl)biphenyl (abbreviation: CBP), 9-[4-(N-carbazolyl)phenyl]-10-phenylanthracene (abbreviation: CzPA), or 9-phenyl-3-[4-(10-phenyl-9-anthryl)phenyl]-9H-carbazole (abbreviation: PCzPA), or an anthracene derivative, such as t-BuDNA, 9,10-di(2-naphthyl)anthracene (abbreviation: DNA), or 9,10-diphenylanthracene (abbreviation: DPAnth), may be used.

For the hole-transport layer 106, a high molecular compound such as PVK, PVTPA, PTPDMA, or Poly-TPD may also be used.

The light-emitting layer 108 is a layer including a light-emitting material. For example, a fluorescent compound which exhibits fluorescence or a phosphorescent compound which exhibits phosphorescence can be used as the light-emitting material. As the fluorescent compound that can be used for the light-emitting layer 108, a material for blue light emission, a material for green light emission, a material for yellow light emission, and a material for red light emission are given. Examples of a light-emitting material which emits blue light include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Examples of a light-emitting material which emits green light include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracene-2-amine (abbreviation: 2YGABPhA), and N,N,9-triphenylanthracen-9-amine (abbreviation: DPhAPhA). Examples of a light-emitting material which emits yellow light include rubrene, and 5,12-bis(1,1'-biphenyl-4-yl)-6,11-diphenyltetracene (abbreviation: BPT). Examples of a light-emitting material which emits red light include N,N,N',N'-tetrakis(4-methylphenyl)tetracen-5,11-diamine (abbreviation: p-mPhTD), and 7,14-diphenyl-N,N,N',N'-tetrakis(4-methylphenyl)acenaphtho[1,2-a]fluoranthen-3,10-di amine (abbreviation: p-mPhAFD).

Examples of the phosphorescent compound that can be used for the light-emitting layer 108 are given below. Examples of a light-emitting material that emits green light include tris(2-phenylpyridinato-N,$C^{2'}$)iridium(III) (abbreviation: Ir(ppy)$_3$), bis(2-phenylpyridinato-N,$C^{2'}$)iridium(III) acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of a light-emitting material that emits yellow light include bis(2,4-diphenyl-1,3-oxazolato-N,$C^{2'}$)iridium(III)acetylacetonate (abbreviation: Ir(dpo)$_2$(acac)), bis[2-(4'-(perfluorophenylphenyl)pyridinato]iridium(III) acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. Examples of a light-emitting material that emits orange light include tris(2-phenylquinolinato-N,$C^{2'}$)iridium(III) (abbreviation: Ir(pq)$_3$), bis(2-phenylquinolinato-N,$C^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), and the like. Examples of a light-emitting material that emits red light include the following organometallic complexes: bis[2-(2'-benzo[4,5-α]thienyl)pyridinato-N,$C^{3'}$]iridium(III)acetylacetonate (abbreviation: Ir(btp)$_2$ (acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$ (acac)), (dipivaloylmethanato)bis(2,3,5-triphenylpyrazinato)iridium(III) (abbreviation: Ir(tppr)$_2$(dpm)), (2,3,7,8,12,13,17,18-octaethyl-21H,23H-porphyrin)platinum(II) (abbreviation: PtOEP), and the like. In addition, a rare earth metal complex such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenyl)-3,3,3-trifluoroacetonato](monophenanthroline)europium(III) (abbreviation: Eu(TTA)$_3$(Phen)) exhibits light emission from a rare earth metal ion (electron transition between different multiplicities); therefore, such a rare earth metal complex can be used as a phosphorescent compound.

As the light-emitting material, a high molecular compound may be used. Specifically, examples of a light-emitting material that emits blue light include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Examples of a light-emitting material that emits green light include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenfluorenylene)-alt-co-(2-methoxy-5-(2-ethylhexyloxy)-1,4-phenylene)], or the like. Furthermore, examples of a light-emitting material that emits orange to red light include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, when complementary colored light emitted from substances is mixed, white light emission can be obtained. This can be applied to a light-emitting element including three or more layers each containing a light-emitting organic compound.

The electron-transport layer 110 is a layer containing a substance having a high electron-transport property (the substance preferably has an electron mobility of $10^{-6}$ cm$^2$/Vs or higher). Examples of the substance having a high electron-transport property include metal complexes such as tris(8-quinolinolato)aluminum (abbreviation:Alq$_3$); tris(4-methyl-8-quinolinolato)aluminum (abbreviation: Almq$_3$); bis(10-hydroxybenzo[h]-quinolinato)beryllium (abbreviation: BeBq$_2$); BAlq; Zn(BOX)$_2$; and bis[2-(2-hydroxyphenyl)benzothiazolato]zinc (abbreviation: Zn(BTZ)$_2$). Further, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can also be used. Further, a high molecular compound such as poly(2,5-pyridinediyl) (abbreviation: PPy), poly[(9,9-dihexylfluoren-2,7-diyl)-co-(pyridin-3,5-diyl)] (abbreviation: PF-Py) or poly[(9,9-dioctylfluoren-2,7-diyl)-co-(2,2'-bipyridin-6,6'-diyl)] (abbreviation: PF-BPy) can also be used. Note that a substance other than the above-mentioned materials may be used for the electron-transport layer as long as the substance has a higher electron-transport property than a hole-transport property.

The electron-transport layer 110 is not limited to a single layer and may be a stacked layer of two or more layers containing the aforementioned substances.

The electron-injection layer 112 is a layer containing a substance having a high electron-injection property. For the electron-injection layer 112, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride may also be used. Alternatively, any of the above-described substances that are used for forming the electron-transport layer 110 may be used.

For the cathode 114, a metal, an alloy, an electrically-conductive compound, a mixture thereof, or the like having a low work function (specifically, a work function of 3.8 eV or lower) can be used. Specific examples of such a material for the cathode 114 include an element belonging to Group 1 or 2 of the periodic table, i.e., an alkali metal such as lithium or cesium, an alkaline earth metal such as magnesium, calcium, or strontium, an alloy containing any of these metals Ouch as MgAg or AlLi), a rare-earth metal such as europium or ytterbium, an alloy containing such rare-earth metals, and the like.

Note that in the case where the cathode 114 is formed using an alkali metal, an alkaline-earth metal, or an alloy thereof, a vacuum evaporation method or a sputtering method can be used. Alternatively, in the case of using a silver paste or the like, a coating method, an inkjet method, or the like may be used.

Note that the structure of the light-emitting element in this embodiment is not limited to the structure illustrated in FIG. 1.

The positions of an anode and a cathode of the light-emitting element in this embodiment may be reversed from the positions illustrated in FIG. 1. In other words, the light-emitting element in this embodiment may include a cathode provided over a substrate, an electron-injection layer provided over the cathode, an electron-transport layer provided over the electron-injection layer, a light-emitting layer provided over the electron-transport layer, a hole-transport layer provided over the light-emitting layer, a hole-injection layer provided over the hole-transport layer, and an anode provided over the hole-injection layer.

The light-emitting element in this embodiment is provided with at least the hole-injection layer and the light-emitting layer. The electron-injection layer, the electron-transport layer, and the hole-transport layer are not necessarily provided.

Figure 2:
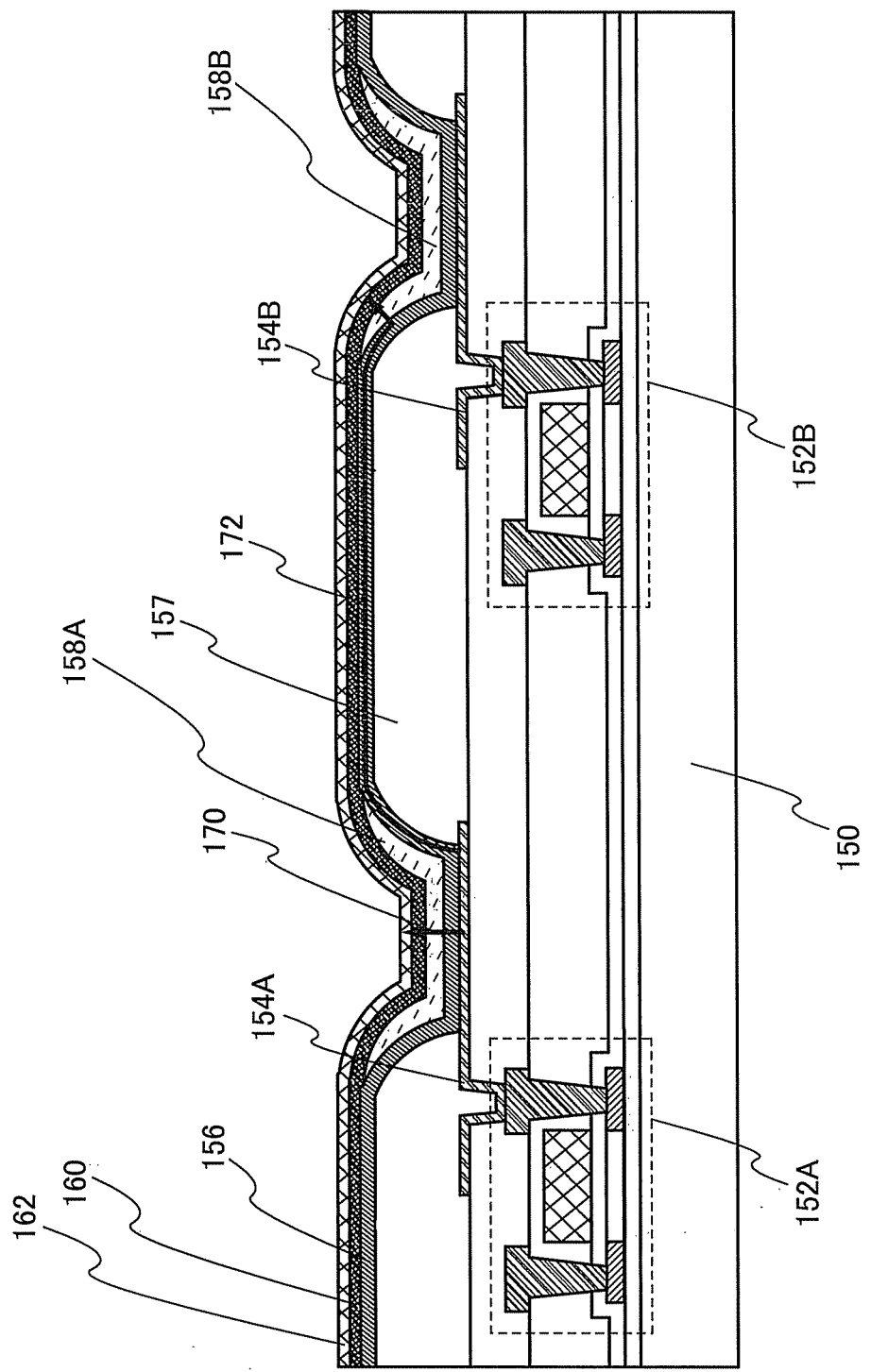
FIG. 2 illustrates a light-emitting device which is one embodiment of the present invention.

The light-emitting element in this embodiment illustrated in FIG. 1 can be applied to a light-emitting device. FIG. 2 illustrates an example of a structure of a light-emitting device to which the light-emitting element illustrated in FIG. 1 is applied.

The light-emitting device illustrated in FIG. 2 includes a first transistor 152A and a second transistor 152B over a substrate 150; a first anode 154A electrically connected to one of a source and a drain of the first transistor 152A; a second anode 154B electrically connected to one of a source and a drain of the second transistor 152B; a hole-injection layer 156 over the first anode 154A; a first light-emitting layer 158A over the hole-injection layer 156 and in a region where the hole-injection layer 156 and the first anode 154A overlap with each other (a light-emitting region); a second light-emitting layer 158B over the hole-injection layer 156 and in a region where the hole-injection layer 156 and the second anode 154B overlap with each other (a light-emitting region); an electron-injection layer 160 on the first light-emitting layer 158A and the second light-emitting layer 158B and on parts of the hole-injection layer 156, over which the light-emitting layers are not provided; and a cathode 162 over the electron-injection layer 160.

Figure 3:
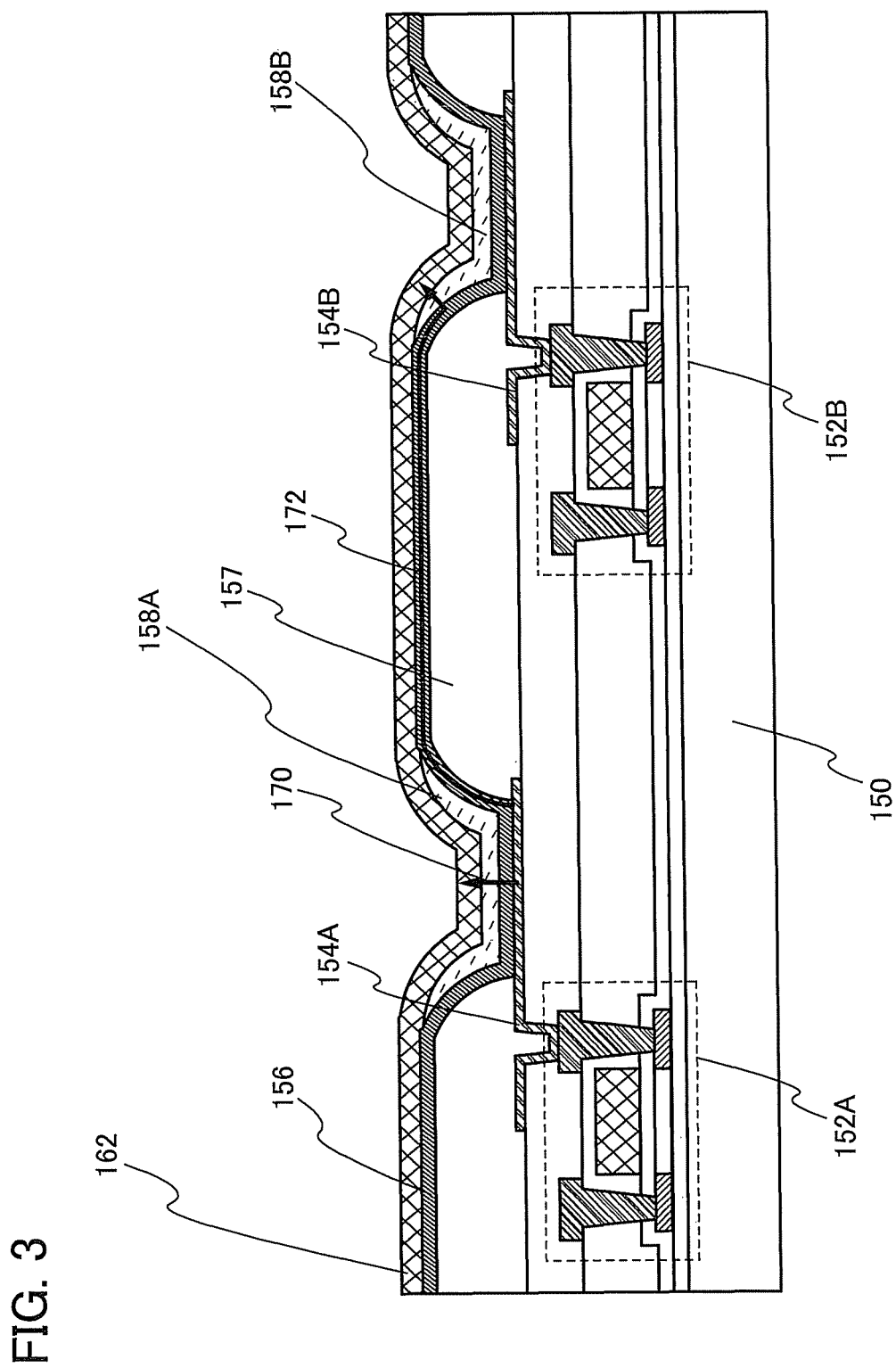
FIG. 3 illustrates a light-emitting device which is one embodiment of the present invention.

Although FIG. 2 illustrates one embodiment in which the hole-injection layer 156, the first light-emitting layer 158A, the second light-emitting layer 158B, and the electron-injection layer 160 are included as the EL layer, one embodiment of the present invention is not limited thereto. In other words, the hole-transport layer and the electron-transport layer may be provided as in FIG. 1, or the electron-injection layer 160 is not necessarily provided. FIG. 3 illustrates the structure in which the electron-injection layer 160 is not provided.

The light-emitting device illustrated in FIG. 2 includes a first pixel and a second pixel adjacent to the first pixel. A light-emitting region of the first pixel is formed using the first light-emitting layer 158A and a light-emitting region of the second pixel is formed using the second light-emitting layer 158B.

Note that although top-gate transistors are illustrated as the first transistor 152A and the second transistor 152B, one embodiment of the present invention is not limited thereto. The first transistor 152A and the second transistor 152B may be each a top-gate transistor as illustrated in FIG. 2 or a bottom-gate transistor. Further, there is no particular limitation on a material of a semiconductor layer included in the first transistor 152A and the second transistor 152B. The material of the semiconductor layer included in the first transistor 152A and the second transistor 152B may be silicon or an oxide semiconductor.

Note that the cathode 162 has a fixed constant potential.

Here, the case where the first pixel emits light and the second pixel does not emit light will be described. The first pixel is made to emit light by generating a potential difference between the first anode 154A and the cathode 162 and by flowing current from the first anode 154A to the cathode 162 (a first current path 170).

In the light-emitting device illustrated in FIG. 2, however, the hole-injection layer 156 is continuous from the first pixel to the second pixel. Therefore, in the case where the hole-injection layer 156 has low resistance, there is such a problem that when the first pixel is made to emit light, current flows to the cathode 162 passing through the hole-injection layer 156 and the second light-emitting layer 158B (a second current path 172), which causes light emission from the second pixel. In this manner, an adjacent pixel emits light; thus, crosstalk occurs.

In view of the above, in this embodiment, an additive is added to the hole-injection layer containing molybdenum oxide so that crystallization of the hole-injection layer is suppressed and crosstalk between adjacent pixels is prevented from occurring. The additive is a material that can be evaporated.

A donor substance can be used as the additive, for example. The donor substance is an alkali metal or an alkaline earth metal. Li or Ca is preferably used as the donor substance. This is because Li is uniformly mixed into a material for the hole-injection layer easily. In the case of using Li as the additive, the concentration of Li is preferably 1 wt % to 10 wt %. Ca has a lower reactivity with the air and water than Li, and thus is easily handled.

Alternatively, as the additive, a substance having a low reactivity with molybdenum oxide may be used, for example. The size of a substance used as the additive is preferably large (equal to or larger than a host material) because the substance is used to decrease the conductivity of the hole-injection layer.

Note that the HOMO level of the substance having a low reactivity with molybdenum oxide is lower than or equal to −5.8 eV, preferably lower than or equal to −5.9 eV. Examples of the substance having a low reactivity with molybdenum oxide include a dibenzoquinoxaline-based substance, a phenanthroline-based substance, a triazole-based substance, and an oxadiazole-based substance.

Examples of the dibenzoquinoxaline-based substance include 2-[3-(dibenzothiophen-4-yl)phenyl]dibenzo[f,h]quinoxaline, 2-[4-(3,6-diphenyl-9H-carbazol-9-yl)phenyl]dibenzo[f,h]quinoxaline, 2-[3-(dibenzothiophen-4-yl)phenyl]-3-phenyldibenzo[f,h]quinoxaline, 7-[3-(dibenzothiophen-4-yl)phenyl]dibenzo[f,h]quinoxaline, 2-phenyldibenzo[f,h]quinoxaline, 2-[3-(3,6-diphenyl-9H-carbazol-9-yl)phenyl]dibenzo[f,h]quinoxaline, 2-[4-(dibenzothiophen-4-yl)phenyl]dibenzo[f,h]quinoxaline, 2-[3-(3'-dibenzothiophen-4-yl)biphenyl]dibenzo[f,h]quinoxaline, 2-[3-(dibenzofuran-4-yl)phenyl]dibenzo[f,h]quinoxaline, 6-[3-(dibenzothiophen-4-yl)phenyl]-dibenzoquinoxaline, and 2-[4-(dibenzothiophen-2-yl)phenyl]dibenzo[f,h]quinoxaline.

Examples of the phenanthroline-based substance include 2,9-dimethyl-4,7-diphenyl-1,10-phenanthroline, 2-(4-t-butylphenyl)-4,7-diphenyl-1,10-phenanthroline, 2-naphthyl-4,7-diphenyl-1,10-phenanthroline, and 2-(naphthalen-2-yl)-4,7-diphenyl-1,10-phenanthroline.

Examples of the triazole-based substance include 9-[4-(3,5-diphenyl-1H-1,2,4-triazol-1-yl)]phenyl-9H-carbazole (abbreviation: CzTAZ(1H)), 9-[4'''-(3,5-diphenyl-1H-1,2,4-triazol-1-yl)-[1,1':2',1'':2''',1''']quaterphenyl-4-yl]-9H-carbazole (abbreviation: Z-CzPTAZ(1H)), and 3-[4-(dibenzothiophen-4-yl)phenyl]-4,5-diphenyl-4H-1,2,4-triazole (abbreviation: DBTTAZ-2).

Examples of the oxadiazole-based substance include 9-[4-(3-phenyl-1,2,4-oxadiazol-5-yl)]phenyl-9H-carbazole (abbreviation: CzOd), 2,5-[4-(dibenzothiophen-1-yl)diphenyl]-1,3,4-oxadiazole, 2,5-[4-(2,7-diphenyldibenzothiophen-4-yl)diphenyl]-1,3,4-oxadiazole, and 2,5-bis[4,4''(dibenzothiophen-1-yl)phenyl]-1,3,4-oxadiazole.

Alternatively, in one embodiment of the present invention, a substance having a hole mobility lower than or equal to $10^{-7}$ cm$^2$/Vs may be used as the additive. Here, the additive is preferably an organic substance.

Note that the thickness of the hole-injection layer 156 in a flat portion over the first light-emitting layer 158A and the second light-emitting layer 158B is substantially equal to the thickness of the hole-injection layer 156 in a flat portion over a partition wall 157.

Figure 4A:
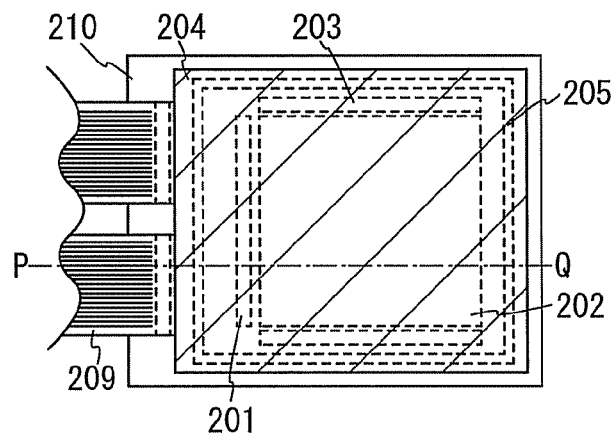
FIGS. 4A and 4B illustrate a light-emitting device which is one embodiment of the present invention.
Figure 4B:
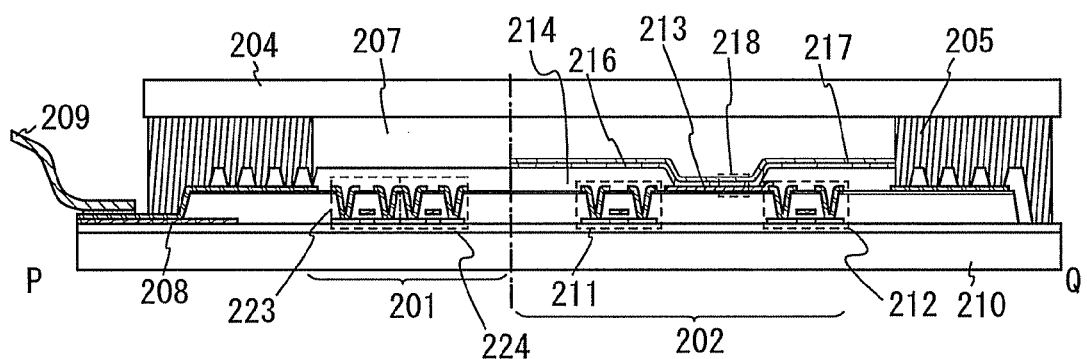

The light-emitting device in this embodiment may be an active matrix light-emitting device or a passive-matrix light-emitting device. FIGS. 4A and 4B illustrate an active matrix structure as an example of the light-emitting device in this embodiment.

FIG. 4A is a top view of the light-emitting device, and FIG. 4B is a cross-sectional view taken along line P-Q in FIG. 4A. The light-emitting device illustrated in FIGS. 4A and 4B includes a source side driver circuit 201, a pixel portion 202, a gate side driver circuit 203, a sealing substrate 204, and a sealant 205. A space 207 is surrounded by the sealant 205.

Note that a lead wiring 208 transmits signals that are to be inputted to the source side driver circuit 201 and the gate side driver circuit 203, and receives a video signal, a clock signal, a start signal, a reset signal, and the like from an FPC 209 which serves, as an external input terminal. Although only the FPC is shown here, a printed wiring board (PWB) may be attached to the FPC.

Next, a cross-sectional structure is described with reference to FIG. 4B. The source side driver circuit 201, the gate side driver circuit 203, and the pixel portion 202 including a plurality of pixels are provided over a substrate 210. Here, the source side driver circuit 201 and one of the plurality of pixels formed in the pixel portion 202 are illustrated.

Note that although the source side driver circuit 201 preferably includes a CMOS circuit having an n-channel transistor 223 and a p-channel transistor 224 in combination, the source side driver circuit 201 may include only a PMOS circuit or only an NMOS circuit.

Although FIGS. 4A and 4B illustrate the structure in which the driver circuits (the source side driver circuit 201 and the gate side driver circuit 203) are provided over the substrate, one embodiment of the present invention is not limited thereto. A structure in which the driver circuits (the source side driver circuit 201 and the gate side driver circuit 203) are provided over different substrates may be employed.

The pixel portion 202 is formed of a plurality of pixels each including a switching transistor 211, a current control transistor 212, and a first electrode 213 electrically connected to a drain of the current control transistor 212. Note that a partition wall 214 is formed so as to cover the edge of the first electrode 213. The partition wall 214 may be formed of a positive photosensitive acrylic resin material, for example.

In order to obtain excellent coverage with a layer formed over the partition wall 214, the partition wall 214 is preferably formed to have a curved surface with curvature at an upper end portion or a lower end portion thereof. For example, in the case where a positive photosensitive acrylic is used as a material for the partition wall 214, it is preferable that an upper edge portion of the partition wall 214 have a curved surface with a curvature radius of 0.2 μm to 3 μm. A material for the partition wall 214 may be a negative photosensitive material that becomes insoluble in an etchant by light exposure or a positive photosensitive material that becomes soluble in an etchant by light exposure.

An EL layer 216 and a second electrode 217 are provided over the first electrode 213. The first electrode 213 corresponds to the first anode 154A and the second anode 154B in FIG. 2. The second electrode 217 corresponds to the cathode 162 in FIG. 2.

The characteristics of the EL layer 216 are the same as those described using FIG. 2.

In FIGS. 4A and 4B, the sealing substrate 204 is attached to the substrate 210 with the use of the sealant 205, whereby a structure in which the light-emitting element 218 is provided in a space 207 surrounded by the substrate 210, the sealing substrate 204, and the sealant 205 is obtained. The space 207 may be filled with an inert gas (e.g., nitrogen or argon) or with the sealant 205.

In order to prevent deterioration of the light-emitting element 218, the substrate 210, the sealing substrate 204, and the sealant 205, which surround the space 207, are preferably formed of substances through which moisture and oxygen cannot penetrate easily.

The sealing substrate 204 may be a glass substrate, a quartz substrate, or a plastic substrate. Examples of a material of the plastic substrate used as the sealing substrate 204 include fiberglass-reinforced plastic (FRP), polyvinyl fluoride (PVF), polyester, and an acrylic resin.

It is preferable to use a resin film having a high barrier property whose vapor permeability coefficient is less than or equal to $1.0 \times 10^{-7}$ g/m$^2$/day as the sealing substrate 204. Such a resin film having a high barrier property has flexibility despite having the vapor permeability coefficient that is as low as the vapor permeability coefficient of a glass substrate; therefore, a device having flexibility can be manufactured. In addition, the device can be rolled up due to its flexibility, which leads to high productivity and cost reduction. Note that a device including the light-emitting element 218 may be sealed between two sealing substrates.

Figure 5A:
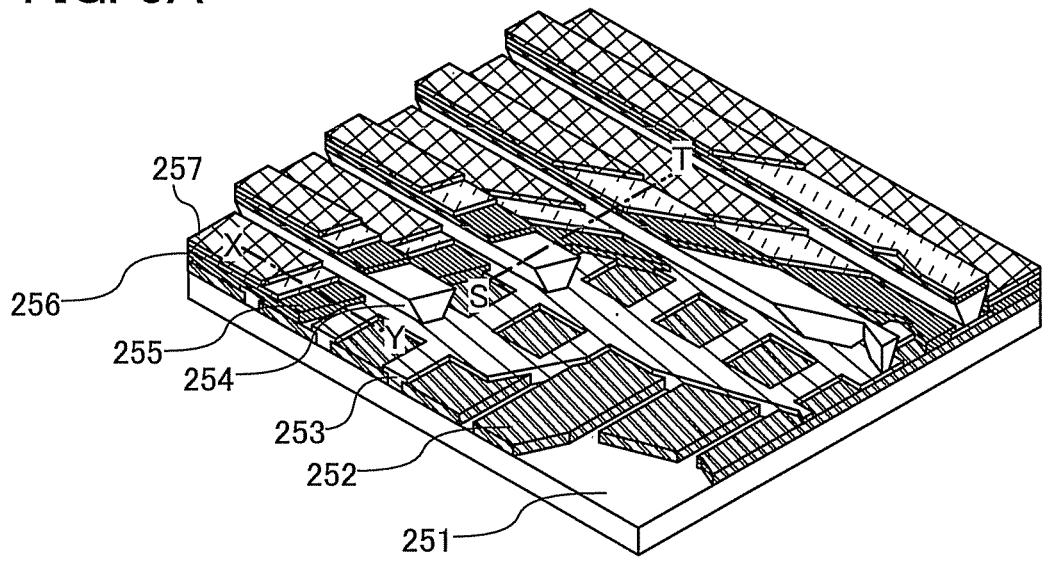
FIGS. 5A to 5C illustrate a light-emitting device which is one embodiment of the present invention.
Figure 5B:
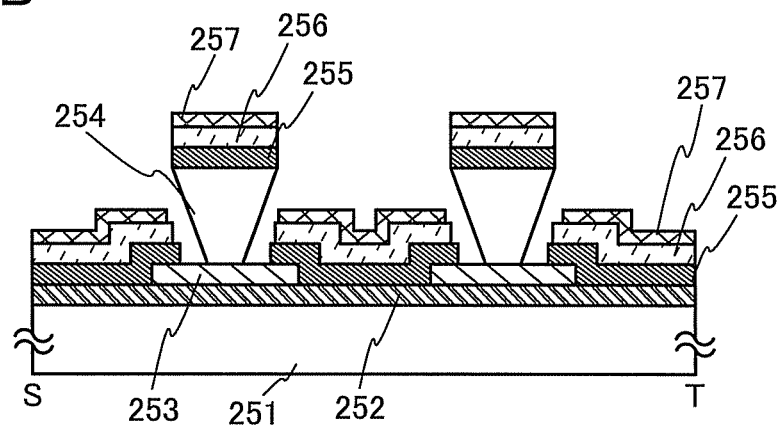
Figure 5C:
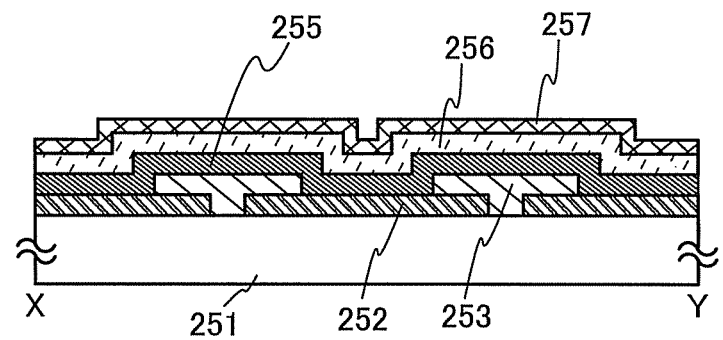

FIGS. 5A to 5C illustrate a passive-matrix structure as an example of the light-emitting device in this embodiment. FIG. 5A is a perspective view illustrating of a passive-matrix light-emitting device. FIG. 5B is a cross-sectional view taken along S-T in FIG. 5A. FIG. 5C is a cross-sectional view taken along X-Y in FIG. 5A.

In FIGS. 5A to 5C, a first electrode 252, a second electrode 257, and a hole-injection layer 255 and a light-emitting layer 256 which are provided between the first electrode 252 and the second electrode 257 are provided over a substrate 251. In addition, an edge of the first electrode 252 is covered with an insulating layer 253, and a partition wall 254 is provided over the insulating layer 253.

As in FIGS. 5A and 5B, sidewalls of the partition wall 254 are sloped so that the distance between one sidewall and the other side wall becomes shorter toward the substrate 251. Therefore, the cross section of the partition wall 254 in the short-side direction is an inverted trapezoid in which the lower base (the side in contact with the insulating layer 253) is shorter than the upper base (the side in contact with the hole-injection layer 255). By providing the partition wall 254 with such a shape, a defect of the light-emitting element due to static electricity or the like can be prevented.

As in FIG. 5C, the hole-injection layer 255 is continuous between adjacent pixels. Hence, in the case where the hole-injection layer 255 has low resistance, light emission in one pixel causes light emission from an adjacent pixel in some cases; thus, crosstalk occurs between adjacent pixels. Such crosstalk can be prevented from occurring according to one embodiment of the present invention, as described referring to FIG. 2.

Note that the light-emitting device which is one embodiment of the present invention preferably has a top emission structure. With the top emission structure, light emitted can be extracted without being blocked by a wiring layer or the like; thus, the aperture ratio can be increased.

It is preferable that the light-emitting device which is one embodiment of the present invention be designed so that white light is emitted from light-emitting elements and red light, blue light, and green light are extracted with the use of a color filter overlapping with the light-emitting elements. With such a structure, it is not necessary to separately form light-emitting elements for each color.

Such a light-emitting device designed so that white light is emitted from light-emitting elements and red light, blue light, and green light are extracted with the use of a color filter overlapping with the light-emitting elements does not need a polarizing plate, which is preferable.

Further, in the light-emitting device designed so that white light is emitted from light-emitting elements and red light, blue light, and green light are extracted with the use of a color filter overlapping with the light-emitting elements, the width of the partition wall can be small as compared with that in a light-emitting device in which light-emitting elements for each color are separately formed; thus, the aperture ratio is improved, which is preferable.

Furthermore, the process of separately forming light-emitting elements for each color is not performed in the manufacturing of the light-emitting device designed so that white light is emitted from light-emitting elements and red light, blue light, and green light are extracted with the use of a color filter overlapping with the light-emitting elements; thus, a metal mask used for separately forming light-emitting elements for each color is unnecessary, which is preferable. In the case where the metal mask is unnecessary, light-emitting elements can be formed over a large-sized substrate, which is preferable.

The process of separately forming light-emitting elements for each color is not needed in the manufacturing of the light-emitting device designed so that white light is emitted from light-emitting elements and red light, blue light, and green light are extracted with the use of a color filter overlapping with the light-emitting elements, which is preferable. Thus, the process is simplified in this manner, thereby increasing the yield, which is preferable.

As described above, the light-emitting device designed so that white light is emitted from light-emitting elements and red light, blue light, and green light are extracted with the use of a color filter overlapping with the light-emitting elements has many advantages; for example, it is not necessary to separately from light-emitting elements for each color. In such a light-emitting device, the light-emitting layer may be continuous between adjacent pixels. When the light-emitting layer is continuous between the adjacent pixels, however, crosstalk can occur due to electrical continuity between the adjacent pixels through the light-emitting layer.

Figure 6:
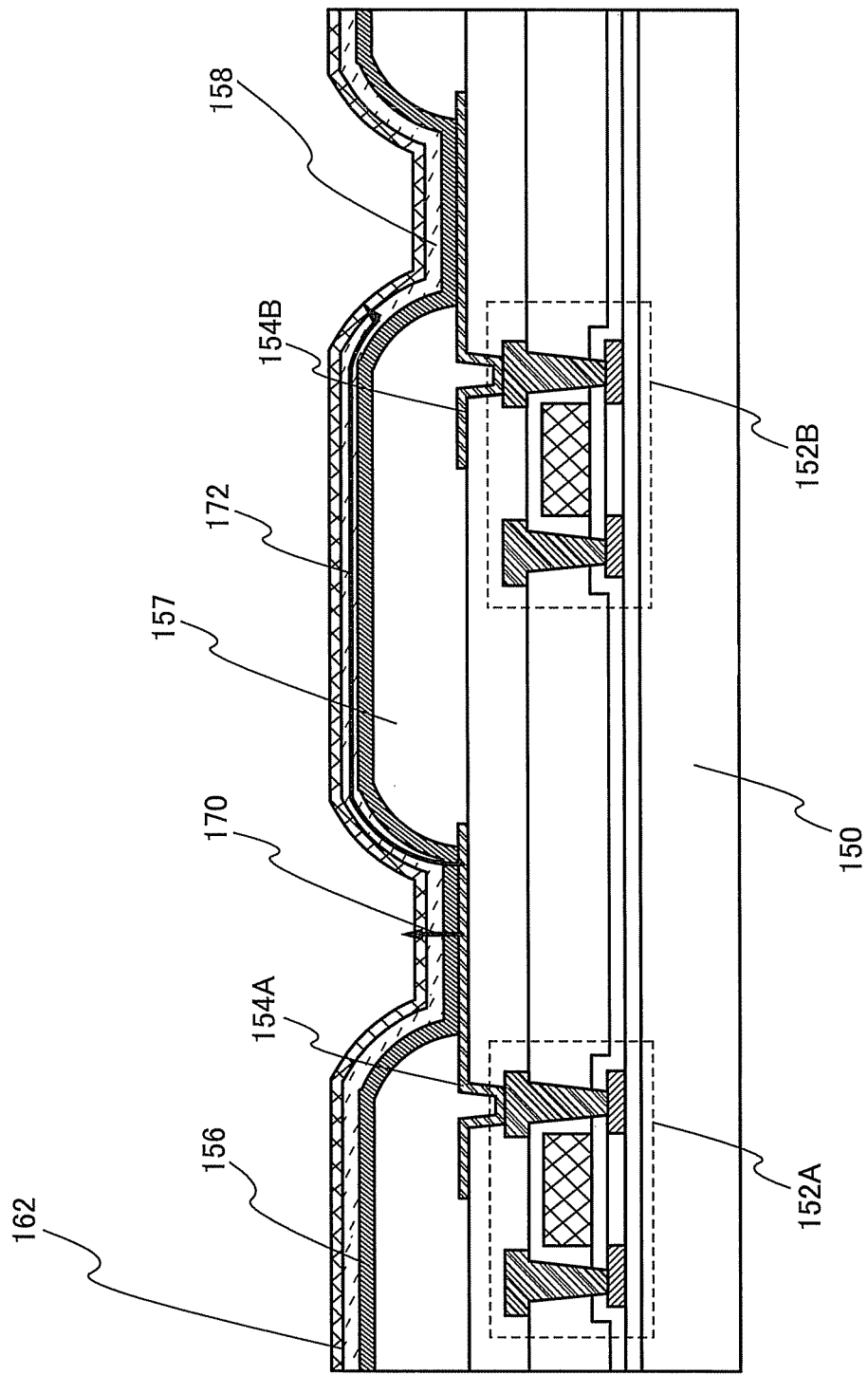
FIG. 6 illustrates a light-emitting device which is one embodiment of the present invention.

A light-emitting device illustrated in FIG. 6 includes a first pixel and a second pixel adjacent to the first pixel. A light-emitting region of the first pixel and a light-emitting region of the second pixel are formed using the continuous light-emitting layer 158.

The adjacent pixels are electrically connected through the light-emitting layer in the light-emitting device illustrated in FIG. 6 in the case where an intermediate layer is included in the light-emitting layer. The conduction occurs because the intermediate layer contains molybdenum oxide.

The intermediate layer includes at least a charge generation region, and may have a structure in which the charge generation region and a layer other than the charge generation region are stacked. For example, a structure can be employed in which the charge generation region, an electron-relay layer, and an electron-injection buffer are stacked in this order from the cathode side.

The behaviors of electrons and holes in the intermediate layer will be described. When voltage that is higher than the threshold voltage of a light-emitting element is applied between an anode and a cathode, holes and electrons are generated in a charge generation region, and the holes transfer to the cathode and the electrons transfer to the electron-relay layer. The electron-relay layer has a high electron-transport property and immediately transfers the electrons generated in the charge generation region to the electron-injection buffer. The electron-relay layer relieves a barrier to injection of electrons into a layer adjacent to the electron-injection buffer on the anode side, so that the efficiency of the injection of electrons into the layer adjacent to the electron-injection buffer on the anode side. Thus, the electrons generated in the charge generation region are injected into the LUMO level of the layer adjacent to the electron-injection buffer on the anode side passing through the electron-relay layer and the electron-injection buffer.

Note that the structure of the light-emitting device illustrated in FIG. 6 is similar to that of the light-emitting device illustrated in FIG. 2 except that the light-emitting layer is continuous between the adjacent pixels.

Embodiment 2

Examples of the electronic devices to which the light-emitting element which is one embodiment of the present invention is applied include cameras such as video cameras or digital cameras, goggle type displays, navigation systems, audio reproducing devices (e.g., car audio components and audio components), computers, game machines, portable information terminals (e.g., mobile computers, cellular phones, portable game machines, and electronic books), and image reproducing devices provided with recording media (specifically, a device capable of reproducing recording media such as digital versatile discs (DVDs) and provided with a display device that can display the image). Specific examples of such electronic devices are illustrated in FIGS. 7A to 7D.

Figure 7A:
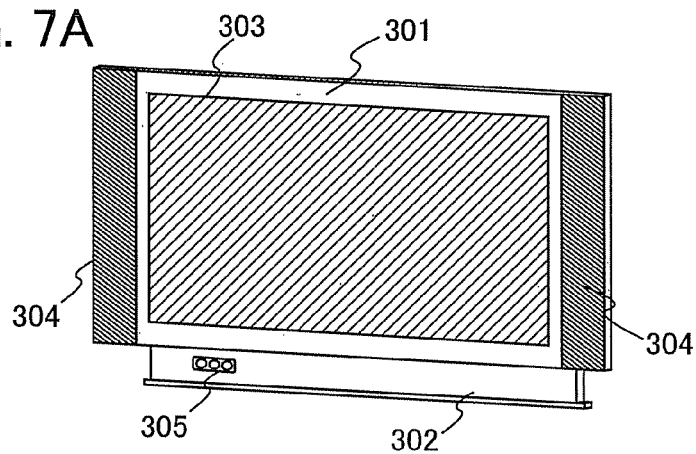
FIGS. 7A to 7D each illustrate an electronic device on which a light-emitting device which is one embodiment of the present invention is mounted.

FIG. 7A illustrates a television set to which the light-emitting element which is one embodiment of the present invention is applied. The television set includes a housing 301, a support 302, a display portion 303, speaker portions 304, a video input terminal 305, and the like. In the display portion 303 of the television set, the light-emitting elements described in Embodiment 1 are arranged in a matrix.

Figure 7B:
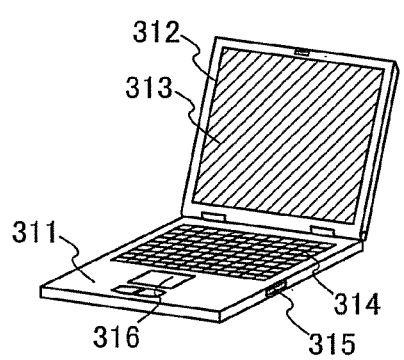

FIG. 7B illustrates a computer to which the light-emitting element which is one embodiment of the present invention is applied. The computer includes a main body 311, a housing 312, a display portion 313, a keyboard 314, an external connection port 315, a pointing device 316, and the like. In the display portion 313 of the computer, the light-emitting elements described in Embodiment 1 are arranged in a matrix.

Figure 7C:
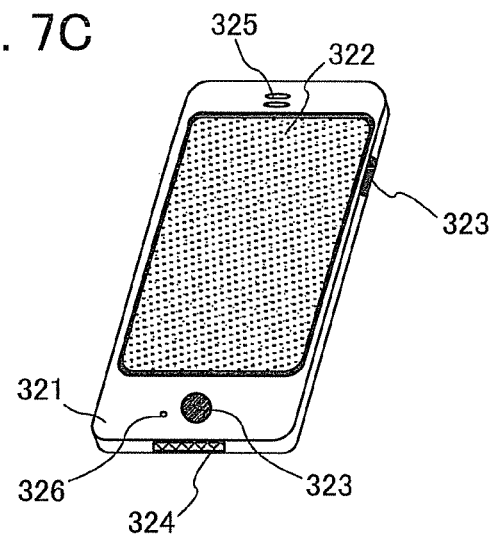

FIG. 7C illustrates a cellular phone to which the light-emitting element which is one embodiment of the present invention is applied. The cellular phone includes a display portion 322 incorporated in a housing 321, an operation button 323, an external connection port 324, a speaker 325, a microphone 326, and the like. Information can be inputted when the display portion 322 is touched with a finger or the like. In addition, operations such as making calls and composing mails can be conducted when a person touches the display portion 322 with his/her finger or the like. In the display portion 322 of the cellular phone, the light-emitting elements described in Embodiment 1 are arranged in a matrix.

Figure 7D:
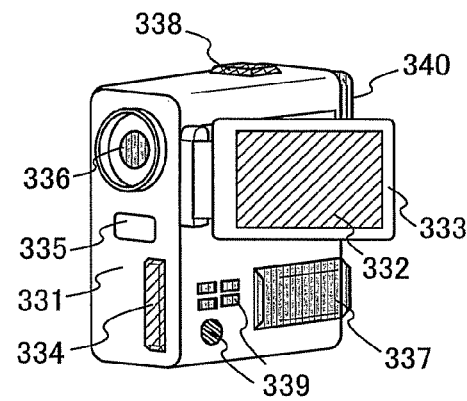

FIG. 7D illustrates a camera to which the light-emitting element which is one embodiment of the present invention is applied. The camera includes a main body 331, a display portion 332, a housing 333, an external connection port 334, a remote control receiving portion 335, an image receiving portion 336, a battery 337, an audio input portion 338, operation keys 339, an eye piece portion 340, and the like. In the display portion 332 of the camera, the light-emitting elements described in Embodiment 1 are arranged in a matrix.

Note that although only display devices including a light-emitting device are described in this embodiment, one embodiment of the present invention is not limited thereto. The light-emitting device which is one embodiment of the present invention may be applied to lighting equipment.

This application is based on Japanese Patent Application serial no. 2011-027998 filed with Japan Patent Office on Feb. 11, 2011, the entire contents of which are hereby incorporated by reference.

What is claimed is:

1. A light-emitting element comprising:
an anode;
a cathode;
a hole-injection layer; and
a light-emitting layer,
wherein the hole-injection layer and the light-emitting layer are provided between the anode and the cathode,
wherein the hole-injection layer is provided between the anode and the light-emitting layer,
wherein the hole-injection layer is a mixed layer consisting of an organic material, molybdenum oxide, and a metal,
wherein the metal is an alkali metal, and
wherein the organic material has hole-transport property.

2. The light-emitting element according to claim 1, wherein the alkali metal is Li.

3. The light-emitting element according to claim 2, wherein a concentration of the Li is higher than or equal to 1 wt % and lower than or equal to 10 wt %.

4. The light-emitting element according to claim 1, wherein a hole mobility of the organic material is higher than or equal to $10^{-6}$ cm$^2$/Vs.

5. The light-emitting element according to claim 1, wherein the light emitting layer emits white light.

6. A light-emitting device comprising the light-emitting element according to claim 1.

7. A lighting device comprising the light-emitting element according to claim 1.

8. A light-emitting element comprising:
an anode;
a cathode;
a hole-transporting layer;
a hole-injection layer; and
a light-emitting layer,
wherein the hole-injection layer, the hole-transporting layer and the light-emitting layer are provided between the anode and the cathode,
wherein the hole-injection layer is provided between the anode and the hole-transporting layer,
wherein the hole-transporting layer is provided between the hole-injection layer and the light-emitting layer,
wherein the hole-injection layer is a mixed layer which includes molybdenum oxide, a first organic material, and a second organic material which is different from the first organic material,
wherein the hole-injection layer is in contact with the anode and the hole-transporting layer,
wherein the first organic material has hole-transport property,
wherein a HOMO level of the second organic material is lower than or equal to −5.8 eV,
wherein the first organic material is one of an aromatic amine, a carbazole-based substance and an anthracene-based substance, and
wherein the second organic material is one of a dibenzoquinoxaline-based substance, a phenanthroline-based substance, a triazole-based substance, and an oxadiazole-based substance.

9. The light-emitting element according to claim 8, wherein a hole mobility of the first organic material is higher than or equal to $10^{-6}$ cm$^2$/Vs and a hole mobility of the second organic material is lower than or equal to $10^{-7}$ cm$^2$/Vs.

10. The light-emitting element according to claim 8, wherein a size of the second organic material of the hole-injection layer is larger than a size of the first organic material of the hole-injection layer.

11. The light-emitting element according to claim 8, wherein the light emitting layer emits white light.

12. A light-emitting device comprising the light-emitting element according to claim 8.

13. A lighting device comprising the light-emitting element according to claim 8.

14. The light-emitting element according to claim 8, wherein the second organic material is selected from the group consisting of 2-dibenzoquinoxaline, 2-dibenzoquinoxaline, 2-3-phenyldibenzoquinoxaline, 7-dibenzoquinoxaline, 2-phenyldibenzoquinoxaline, 2-dibenzoquinoxaline, 2-dibenzoquinoxaline, 2-dibenzoquinoxaline, 2-dibenzoquinoxaline, 6-dibenzoquinoxaline, and 2-dibenzoquinoxaline.

15. A light-emitting element comprising:
an anode;
a cathode;
a hole-injection layer; and
a light-emitting layer,
wherein the hole-injection layer and the light-emitting layer are provided between the anode and the cathode,
wherein the hole-injection layer is provided between the anode and the light-emitting layer,
wherein the hole-injection layer is a mixed layer which includes molybdenum oxide, a first organic material, and a second organic material which is different from the first organic material,
wherein the second organic material is a dibenzoquinoxaline-based substance,
wherein the first organic material has hole-transport property, and
wherein a HOMO level of the second organic material is lower than or equal to −5.8 eV.

16. The light-emitting element according to claim 15, wherein a hole mobility of the first organic material is higher than or equal to $10^{-6}$ cm$^2$/Vs and a hole mobility of the second organic material is lower than or equal to $10^{-7}$ cm$^2$/Vs.

17. A light-emitting device comprising the light-emitting element according to claim 15.

18. A lighting device comprising the light-emitting element according to claim 15.

19. The light-emitting element according to claim 15, wherein the second organic material is selected from the group consisting of 2-dibenzoquinoxaline, 2-dibenzoquinoxaline, 2-3-phenyldibenzoquinoxaline, 7-dibenzoquinoxaline, 2-phenyldibenzoquinoxaline, 2-dibenzoquinoxaline, 2-dibenzoquinoxaline, 2-dibenzoquinoxaline, 2-dibenzoquinoxaline, 6-dibenzoquinoxaline, and 2-dibenzoquinoxaline.

20. The light-emitting element according to claim 15, wherein the first organic material is one of an aromatic amine, a carbazole-based substance and an anthracene-based substance.

* * * * *

UNITED STATES PATENT AND TRADEMARK OFFICE
CERTIFICATE OF CORRECTION

PATENT NO. : 9,088,002 B2  
APPLICATION NO. : 13/370958  
DATED : July 21, 2015  
INVENTOR(S) : Hisao Ikeda et al.

Page 1 of 1

It is certified that error appears in the above-identified patent and that said Letters Patent is hereby corrected as shown below:

In the Specification:

Column 2, Line 32; Change "2-[4-(" to --and 2-[4-(--.

Column 2, Line 41 to 42; Change "(abbreviation CzTAZ(lH))," to --(abbreviation: CzTAZ(1H)),--.

Column 2, Line 43; Change "carb azole" to --carbazole--.

Column 4, Line 40; Change "farmed" to --formed--.

Column 4, Line 52; Change "funned" to --formed--.

Column 5, Line 13; Change "MIDATA)," to --MTDATA),--.

Column 5, Line 15; Change "phenyl}mine" to --phenyl}-N,N'-diphenyl-(1,1'-biphenyl)-4,4'-diamine--.

Column 5, Line 31; Change "[N,N-bis(" to --[N,N'-bis(--.

Column 5, Line 32; Change "N, N-bis" to --N,N'-bis--.

Column 6, Line 30; Change "di amine" to --diamine--.

Column 7, Line 9; Change "thenyl)" to --thenoyl)--.

Column 7, Line 32; Change "diphenyl   amino)" to --diphenylamino)--.

Column 8, Line 35; Change "metals Ouch as" to --metals (such as--.

Column 10, Line 44; Change "carb  azole" to --carbazole--.

Column 11, Line 11; Change "serves, as" to --serves as--.

Column 13, Line 33; Change "from" to --form--.

Signed and Sealed this  
Twenty-ninth Day of March, 2016

Michelle K. Lee  
*Director of the United States Patent and Trademark Office*